United States Patent [19]

Aoki et al.

[11] Patent Number: 4,994,870

[45] Date of Patent: Feb. 19, 1991

[54] STATIC INDUCTION TYPE SEMICONDUCTOR DEVICE

[75] Inventors: Shinobu Aoki; Haruo Takagi, both of Kariya; Hiroshi Tadano, Nagoya; Takashi Suzuki, Aichi; Susumu Sugiyama, Nagoya, all of Japan

[73] Assignees: Kabushiki Kaisha Toyoda Jidoshokki Seisakusho, Kariya; Kabushiki Kaisha Toyota Chuo Kenkyusho, Aichi, both of Japan

[21] Appl. No.: 563,680

[22] Filed: Aug. 2, 1990

Related U.S. Application Data

[63] Continuation of Ser. No. 339,161, Apr. 17, 1989, abandoned.

[30] Foreign Application Priority Data

Apr. 20, 1988 [JP] Japan .................................. 63-98954

[51] Int. Cl.$^5$ ...................... H01L 29/78; H01L 29/72; H01L 29/80
[52] U.S. Cl. ...................................... 357/23.4; 357/36; 357/22
[58] Field of Search .................. 357/23.5, 22 D, 22 E, 357/92, 36, 41, 90, 38, 23.4

[56] References Cited

U.S. PATENT DOCUMENTS

| | | | |
|---|---|---|---|
| 4,284,997 | 8/1981 | Nishizawa | 357/22 |
| 4,470,059 | 9/1984 | Nishizawa et al. | 357/22 |
| 4,618,781 | 3/1981 | Silber et al. | 307/252 |
| 4,639,762 | 1/1987 | Neilson et al. | 357/23.8 |
| 4,791,462 | 12/1988 | Blanchard et al. | 357/23.4 |
| 4,811,064 | 3/1989 | Nishizawa et al. | 357/22 |

OTHER PUBLICATIONS

Electronics, 8/23/65, "Good Teamwork from SCR's", by Reuben Wechsler, pp. 60–64.

IEE Transactions on Electron Devices, vol. ED-34, No. 4, Apr. 87, "An Ultra-Low on Resistance ...", by Ueda et al., pp. 926–930.

"High Speed High Voltage SIT", by Kojiwara et al., 1977, Dec. 5–7, International Electron Devices Meeting, Washington, D.C., pp. 38–41.

IEEE Publication, Dec. 1982, "Normally-Off Type High Speed Si-Thyristor", by Y. Nakamura et al., pp. 480–483.

IEEE Publication, Jun. 1986, vol. ED-33, "Experimental Study on Current Gain of BSIT", by Y. Nakamura et al., pp. 810–815.

Primary Examiner—Andrew J. James
Assistant Examiner—Don Monin
Attorney, Agent, or Firm—Brooks Haidt Haffner & Delahunty

[57] ABSTRACT

A static induction type semiconductor device is used as a power transistor. It is of the surface gate type and is used for providing a high current density. The static induction type semiconductor device provides a plurality of small source regions surrounded by a gate region. According to this structure, the channel region beneath the source region becomes small, thereby increasing the stored carrier density and enabling a large main current to flow when using a small gate current, thereby achieving a high current amplification ratio. Further, when it flows the main current is distributed to the source regions, thus preventing increase in on-voltage.

12 Claims, 7 Drawing Sheets

STATIC INDUCTION TYPE SEMICONDUCTOR DEVICE

This application is a continuation of application Ser. No. 07/339,161, filed Apr. 17, 1989 now abandoned.

BACKGROUND OF THE INVENTION

The present invention relates to a high power semiconductor device, and particularly to a static induction type semiconductor device used as a power transistor for producing a high current density.

A static induction type semiconductor device has been used as one of the semiconductor devices for controlling a large current. The static induction type semiconductor is disclosed in a U.S. patent application Ser. No. 181102 filed on Apr. 13, 1988 and, in pp. 40–44, Nikkei Electronics, 1976.9.20. In the high current density region of such semiconductor apparatuses for controlling a large current, the ratio of main current to be controlled, to control current (called current amplification factor), should be large.

An example of the conventional static induction type semiconductor device (which is called SIT) is described.

Figure 1:
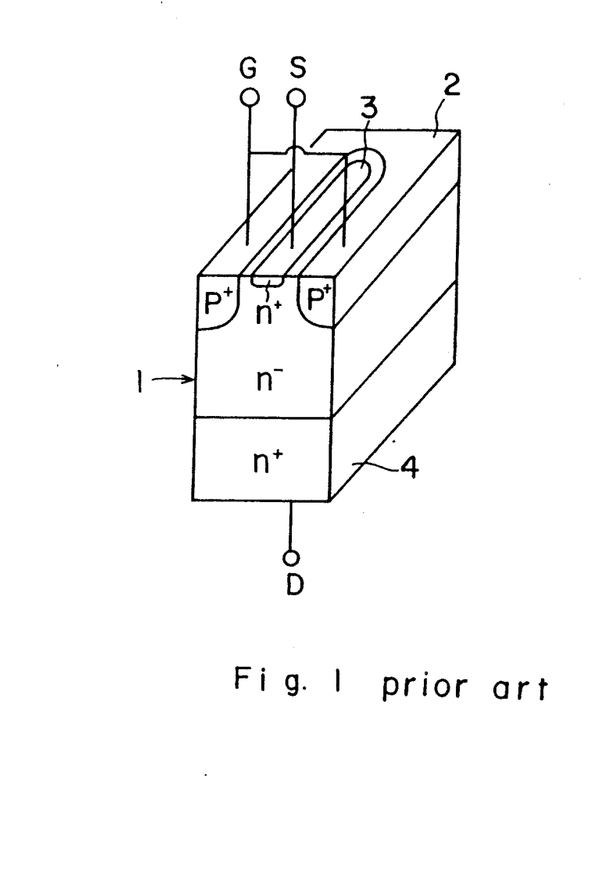
FIG. 1 shows a sectioned perspective view of the conventional surface-gate-type SIT.
Figure 2:
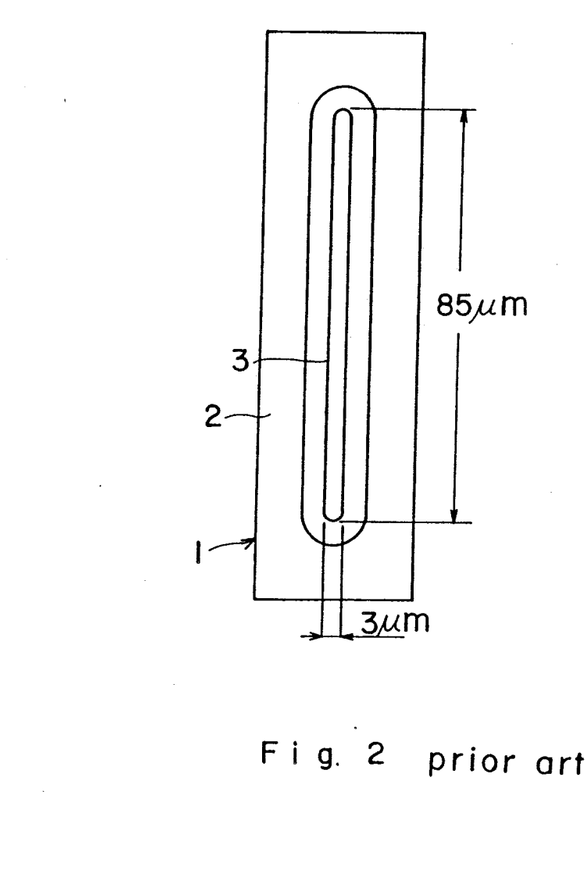
FIG. 2 shows a plan view of the conventional surface-gate-type SIT of FIG. 1.

Examples of conventional static induction transistors of the surface gate type (called surface-gate-type SIT hereafter), used as power switching elements, are presented. The unit structure shown in FIGS. 1 and 2 is used, and a multichannel structure comprising a plurality of these unit structures connected in parallel is also used. Here we describe an n-channel SIT in which electrons, for example, form a main current. The unit structure is formed by providing a semiconductor substrate 1 comprising an n+-type semiconductor layer with an n−-type semiconductor layer formed on it. An elongated ring region is formed on the surface of the n−-type layer, and this is surrounded by a p+-type gate region 2. An n+-type source region 3 is formed inside the elongated ring region. The minus polarity of a source of the main current is connected to the source region 3, and the n+ layer forming the other surface area of the semiconductor substrate 1 provides a drain region 4 to which is connected the plus polarity of a source of the main current. The potential of the channel region immediately beneath the source region 3 is lowered by positive holes injected into it from the gate region 4, and electron injection from the source region 3 is induced, thus producing a transistor operation (switching operation).

However, there is the problem that in the surface-gate-type SIT described above, the area of the source region is unnecessarily large, and when a gate current flows, the density of positive holes stored immediately below the source region 3 is lowered, thereby causing a low current amplification factor $h_{FS}$ ($I_D/I_G$) of drain current $I_D$ to gate current $I_G$.

SUMMARY OF THE INVENTION

An object of the present invention is to solve the above problems and thereby provide a static induction type semiconductor device which achieves a high current amplification factor.

The source current (main current) increases almost exponentially with the density of positive holes in the channel region. When a gate current flows and the channel region is made small, the stored positive hole density becomes very high. Therefore, application of a small gate current can cause a large main current to flow. In other words, the channel potential is changed sufficiently by a small current, and the desired amount of main current can be caused to flow. However, when the main current concentrates at one point, an increase in the on voltage follows. In order to clarify the above effect with a large current and to maintain a withholding voltage of the semiconductor device, it is necessary to appropriately distribute the source region through which the main current flows.

The present invention comprises a source region a semiconductor material of a first conduction type and a gate region of a material of a second conduction type, both being formed on one surface of the semiconductor substrate, such that the gate region surrounds the source regions, and a drain region of material of the first or second conduction type formed on the other surface, characterized in that the source region is divided into at least two source region parts surrounded by the gate region.

When the drain region is made of a material of the first conduction type, the static induction type transistor is formed and when the drain region is made of a material of the second conduction type, a static induction type thyristor structure is formed.

The interval between two adjacent source regions selected from a number of source regions surrounded by said gate region, should be less than the gap between the source region and the drain region. When the electrode is provided in the source region, a thin insulating film for injecting a carrier by the tunnel effect should be interposed between the source regions and the electrode.

In the on-state, a positive hole injected from the gate region into the channel region changes the potentials of respective n− channel regions corresponding to the divided n+ source regions and the electric current flows from respective source region in accordance with the variation in the potential. The source region is appropriately divided so that a large electron current flows from respective source region parts, and uniformly in the semiconductor device, thereby reaching the drain region without increasing the on-voltage.

In order to provide an off-state, it is necessary to extract toward the gate, positive holes stored in the respective n− channels. The total number of positive holes stored in respective channels is small, and they are appropriately distributed. They are thereby quickly drawn to the p+ gate region, thus enabling a cut-off to be conducted.

A thin insulating film provided on the surface of the n+ source region operates as a tunnel-oxidized film, thereby enabling electrons to be injected into the source region but preventing the positive holes from being drawn out. Therefore, as the consumption of positive holes stored in the channel region decreases, a sufficiently large source current is allowed to flow even if a further smaller gate current is injected, thereby further increasing the current amplification factor.

PREFERRED EMBODIMENT OF THE PRESENT INVENTION

An embodiment of the present invention will be explained hereinafter with reference to the drawings.

Figure 3:
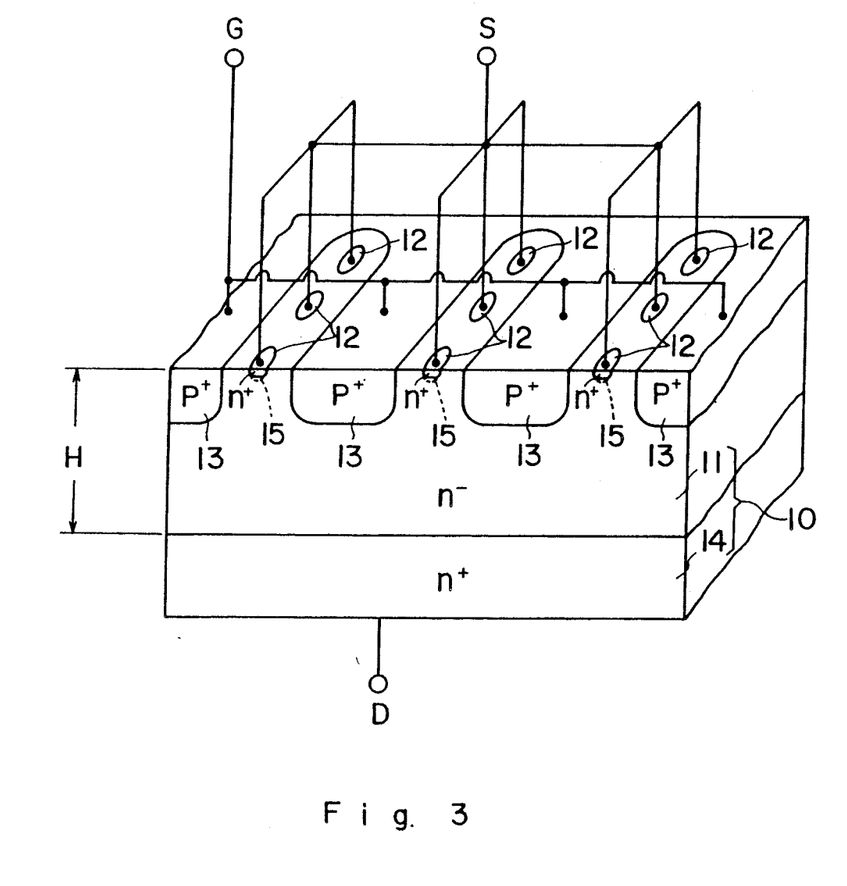
FIG. 3 shows a sectioned perspective view of a surface-gate-type SIT of one embodiment of the present invention.
Figure 4:
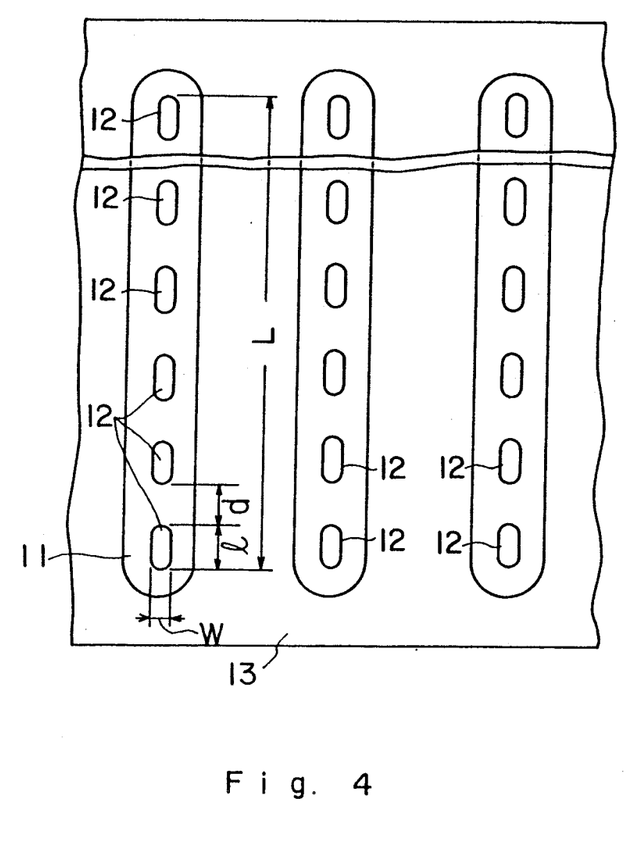
FIG. 4 shows a plan view of the surface-gate-type SIT of the one embodiment of FIG. 3 of the present invention.

The surface-gate-type SIT of the present embodiment is shown in FIGS. 3 and 4. An upper portion (one of the surface portions) of the silicon substrate 10 of the n-type semiconductor substrate forms an $n^-$ region 11, and source regions (source region parts) 12 comprising $n^+$ layers (semiconductor layers of the first conduction type) and a gate region 13 comprising the $p^+$ layer (the semiconductor layer of the second conduction type) are provided in the $n^-$ region 11, the gate region 13 surrounding the source region 12. The gate region 13 is formed to surround the elongated-ring-like region. The source regions 12 surrounded by the gate region 13 is formed of width W equal to 2 microns and length l equal to 5 microns, and gap d between adjacent source regions 12 equal to 5 microns. The source regions 12 are formed along the total length L.

The lower part (the other surface portion) of the silicon substrate 10 forms a drain region 14 comprising an $n^+$ layer (the semiconductor layer of the first conduction type), and the interval H between the source regions 12 and the drain region 14 is, for example, 20 microns. All the source regions 12 are connected to a source electrode S, all the gate regions 13 to a gate electrode G and the drain region 14 to a drain electrode D.

An operation of this surface gate type SIT is explained hereafter.

The surface-gate-type SIT is used with a forward bias applied between the source and the drain. When the gate has the same potential as the source, current does not flow between drain and source, or between gate and source, thereby maintaining the SIT in the off-state. When a forward bias is applied between gate and source, positive holes are injected from the $p^+$ gate region 13 to the $n^-$ channel region 15 immediately beneath the $n^+$ source regions 12, thereby decreasing the potential of the portion immediately beneath the $n^+$ source region 12. The $n^-$ channel region 15 comprises a portion contacting the $n^+$ source regions 12 and surrounded by the $p^+$ gate region 13 and formed in the $n^-$ region 11, the channel region 15 thereby controlling a current from the source region.

Thus, injection of electrons is induced by the $n^+$ source regions 12, and an electron current is caused to flow between drain and source, thereby switching the SIT to the conduction state. Then the drain current $I_D$ corresponding to an amount of injection of gate current $I_G$ can flow.

Thus, an injection of the gate current $I_G$ can be stopped, namely, the potential of the gate can be returned to that of the source, and the SIT can be returned to the off state by depriving the positive hole immediately beneath the $n^+$ source regions 12 by applying a reverse bias to the gate. Thus, as described above, the SIT performs a switching operation.

Figure 5:
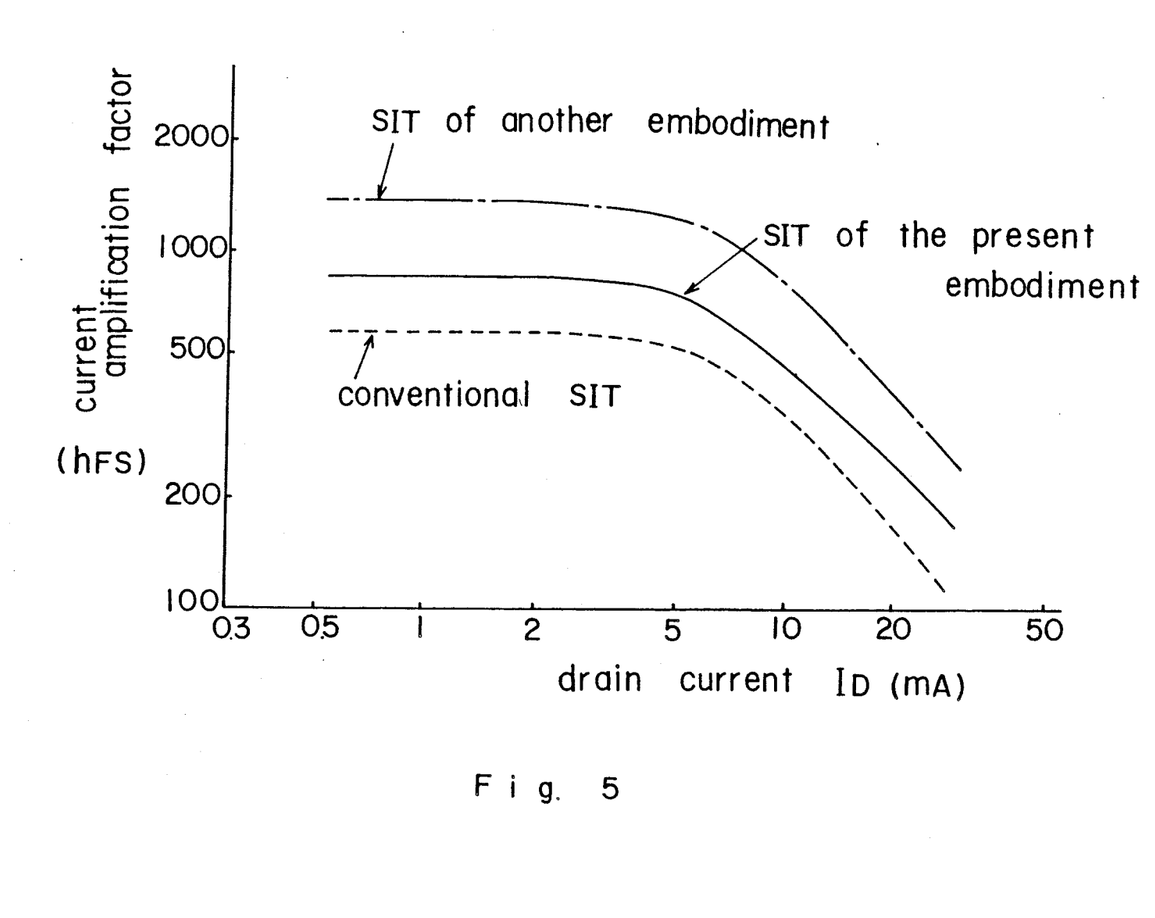
FIG. 5 shows the relationship between a current amplification factor and the drain currents of the surface-gate-type SIT.

The current-amplification characteristics of the surface-gate-type SIT are shown in FIG. 5, which shows the relation between current amplification factor $h_{FS}$ ($=I_D/I_G$) and drain current $I_D$. The current amplification characteristic of the conventional surface-gate-type SIT is shown in FIG. 5 by a dotted line. As shown in FIGS. 1 and 2, the conventional surface-gate type SIT uses, as a source region, a multichannel structure in which a plurality of unit structures is connected in parallel. The unit structure is 3 microns wide and 85 microns long, and other conditions such as shape are the same as those of the present embodiment. In FIG. 5, the voltage $V_{DS}$ between the drain and source is set at 2 volts.

As is clear from FIG. 5, the surface-gate-type SIT of the present invention is found to be superior to the conventional SIT in respect of the current amplification factor $h_{FS}$. Conventionally, it is observed that when it is intended to increase the current amplification factor $h_{FS}$, the withholding voltage of the SIT should be decreased. However, if the current amplification factor $h_{FS}$ increases under a high withholding voltage, the on-voltage increases. It is confirmed that the surface-gate-type SIT of the present embodiment does not have the above defects and the on-voltage and withholding voltage are not sacrificed.

The conventional surface-gate-type SIT has a large source region 3 and positive holes injected into the gate region 2 are rapidly expelled to it, thus preventing the potential immediately beneath the source region 3 from being fully eliminated. In contrast, the surface-gate-type SIT of the present embodiment has at least two smaller source regions (source region parts) whose widths or lengths are small, 2 microns or less, thereby suppressing the positive hole from being driven to the source side. Thus, a less positive hole injection, namely, a lower gate current $I_G$, can provide a sufficient store of positive holes, thereby achieving a high current amplification factor, $h_{FS}$. Further, the plane shape of the source regions 12 is essentially rectangular with rounded ends with the length-to-width ratio reduced almost to the point of becoming square. The width of the source region is made 2 microns or less, thereby achieving a further significant effect in obtaining a higher current amplification factor.

In the surface gate SIT of the present embodiment, the source regions formed within a region surrounded by the $p^+$ gate region 13 are distributed over the surface portion of the semiconductor substrate 10, and can increase the current amplification factor $h_{FS}$ more than the conventional surface gate SIT without sacrificing the on-voltage and withholding voltage. When a plurality of $n^+$ source regions 12 is formed within a region surrounded by $p^+$ gate region 13, only the source pattern formed of a plurality of source regions 12 may be modified in the conventional production method, and the other production step is the same as the conventional one, thereby facilitating production of an SIT.

The present invention is not limited to the above embodiment. In the above embodiment the gap H between the source regions 12 and the drain region 14 is 20 microns, and the gap d between respective n+ source regions 12 in a region surrounded by p+ gate region 13 is 5 microns. It is considered that the area in which the drain current $I_D$ is allowed to flow using respective n+ source regions 12 depends on the gap H. Thus, the gap d between the respective n+ source regions 12 can be changed and set such that a high current amplification factor $h_{FS}$ is obtained, enabling the surface area of the device to be utilized most effectively. In this instance, it is desirable for the gap d between adjacent source regions 12 to be less than the gap H between the source regions 12 and the drain region 14, thereby providing a good current amplification factor and withholding voltage characteristics.

Figure 10:
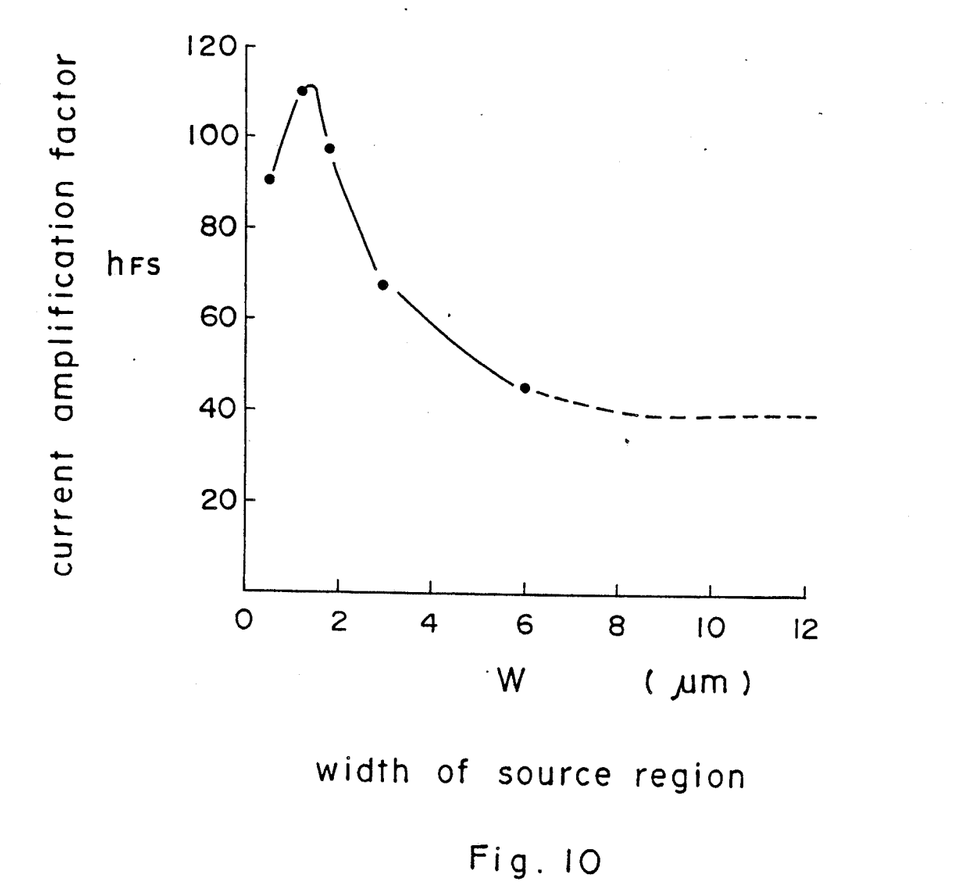
FIG. 10 shows the relationship between current amplification factor and width of the source region.

In the above embodiment, the width of the source region is 2 microns, but the high current amplification factor $h_{FS}$ can be obtained by changing the width to 10 microns as shown in FIG. 10. Furthermore, in the above embodiment, the length of the source regions and the gap between them are both 5 microns, but they may be changed to 200 microns.

Figure 6:
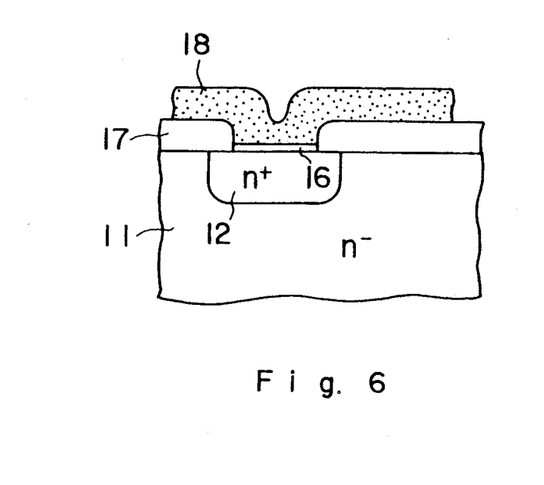
FIG. 6 shows an embodiment of a surface-gate-type SIT.
Figure 7:
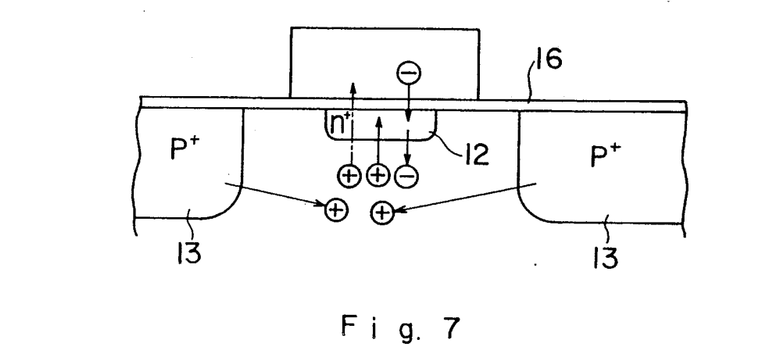
FIG. 7 shows a sectional view of another embodiment of the surface gate type SIT.

As shown in FIG. 6, a thin insulating film about 30 Å thick of, for example, $SiO_2$, may be formed by injecting a carrier into the surface portion of the n+ source regions 12 by a tunnel effect. In FIG. 6, 17 is a silicon oxide film, and 18 is a doped polysilicon layer forming at least a portion of the source electrode. The surface-gate-type SIT with a $SiO_2$ thin film 16 formed between the n+ source regions 12 and the doped polysilicon layer 18, has the characteristic indicated by the dot-dash line in FIG. 5, and can increase the current amplification factor $h_{FS}$ more than the surface-gate-type SIT of the above embodiment. In this case, as shown in FIG. 7, the thin insulating film ($SiO_2$) 16 prevents an expulsion of the positive hole shown by the dot-dash line, making a small amount of gate current sufficient.

Figure 8:
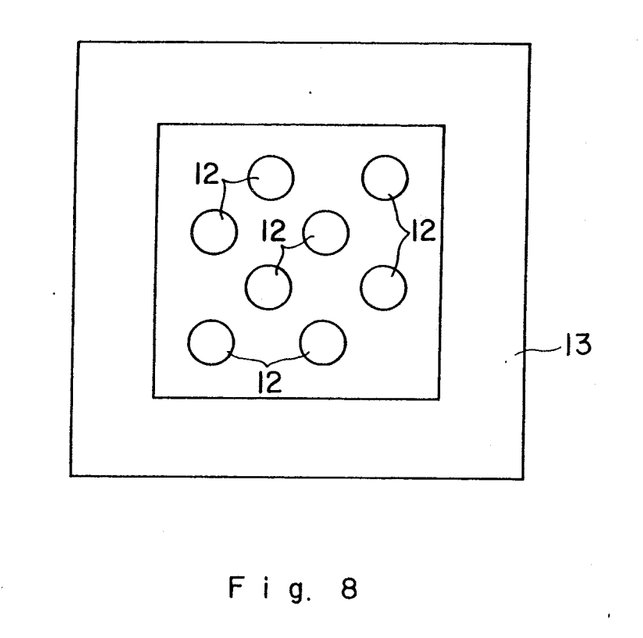
FIG. 8 shows a plan view of other embodiments of the surface-gate-type SIT.

The source regions 12 are arranged in a straight line in the above embodiment. However, they may be arranged two-dimensionally, as shown in FIG. 8.

Figure 9:
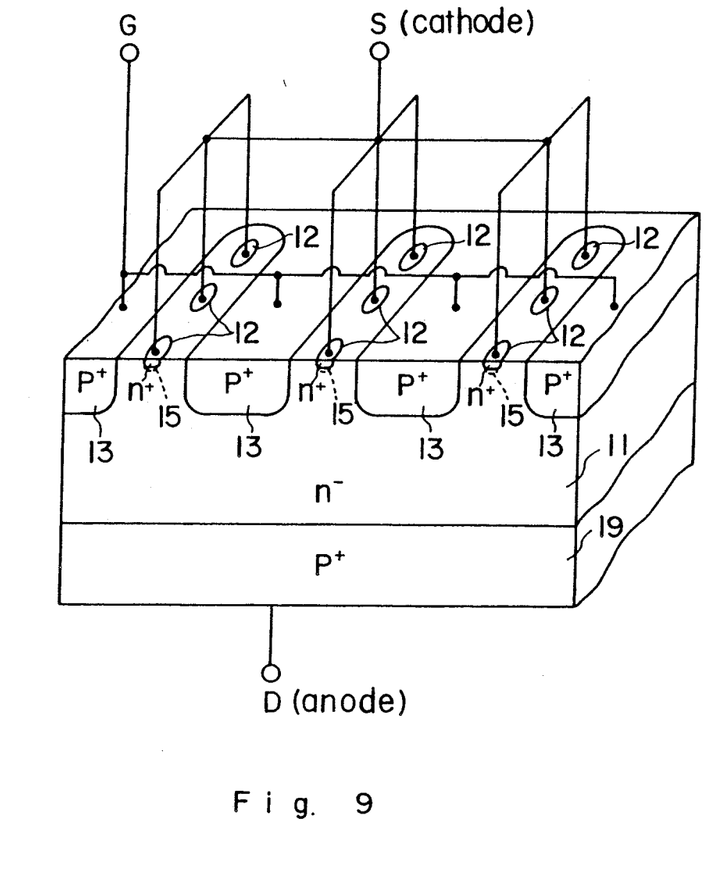
FIG. 9 shows a sectioned perspective view of the static-induction-type thyristor of the present invention.

The above embodiment is formed in a multichannel structure, but the present invention can be practiced as a unitary structure. In the above embodiment, the source and drain regions are n-type and the gate region is p type. Alternatively, source and drain regions may be p-type and the gate region n-type, and positive holes may be used as main carriers. Further, as shown in FIG. 9, the p+ drain region 19 may be provided in place of the n+ drain region 14 in the transistor structure of FIG. 3, and the n+ source regions 12 and the p+ drain region 19 may be used for the cathode region and the anode region respectively, thereby forming a static-induction-type thyristor structure. The present invention is used as a switching element in the above embodiment, but may also be used as an amplification element.

Heat concentration is prevented by providing a plurality of source regions, and thus uniformly distributing the heat producing portion. This also makes the current flow more uniform.

When a current flows from one source, the two-dimensional effect of the gate region arrangement makes the potential difference in the channel nonuniform, thereby making the electric current flow nonuniformly. In contrast, when the source regions are distributed, as shown in the present invention, such two-dimensional effect is difficult to produce, and the change in potential of respective channels is conducted uniformly. This makes the current flow and heat production uniform, thereby drastically increasing the capability of the element.

What is claimed is:

1. A static induction type semiconductor device comprising:
   a semiconductor substrate having a first surface on which a gate region of one conduction type is formed, said gate region surrounding and defining a unified area of said first surface;
   at least two source regions of a conduction type different from said one conduction type formed on said first surface and located spaced apart within said unified area and spaced from said gate region, the space between said source regions and between each source region and said gate region being occupied by said substrate free of any material of a conduction type different from said conduction type of said source regions; and
   a drain region of one of said conduction types located adjacent another surface of said semiconductor substrate.

2. A static induction type semiconductor device according to claim 1 in which each of said source regions has a width that does not exceed 10 microns.

3. A static induction type semiconductor device according to claim 2 wherein the space between any adjacent two of said source regions is less than the interval between the source regions and the drain region.

4. A static induction type semiconductor device according to claim 3 in which each of said source regions is 7 to 10 microns long and 1 to 2 microns wide, and the space between any adjacent two of said source regions is 2 to 10 microns.

5. A static induction type semiconductor device according to claim 3 in which said source regions are provided at equal intervals in a straight line.

6. A static induction type semiconductor device according to claim 3 in which more than two source regions are provided within said unified area of said first surface in a random two-dimensional distribution.

7. A static induction type semiconductor device according to claim 5 in which each of said source regions is no more than 200 microns long, and the space between any adjacent two of said source regions is no more than 200 microns.

8. A static induction type semiconductor device according to claim 3 in which a source electrode is coupled to each of said source regions through a thin layer of insulating material.

9. A static induction type semiconductor device according to claim 8 in which said layer of insulating material is formed of silicon oxide.

10. A static induction type semiconductor device according to claim 9 in which said source electrode comprises a doped silicon layer.

11. A static induction type transistor comprising: a low impurity density region of a first conduction type provided on one surface of a semiconductor substrate; a plurality of spaced apart source regions of high impurity density semiconductor material of said first conduction type located in said low impurity density region; a gate region in said low impurity density region surrounding a unified area containing said source regions, spaced from said source regions and composed of high impurity density semiconductor material of a second conduction type different from said first conduction type, the space between said source regions and between each source region and said gate region begin occupied by a portion of said low impurity density region free of any material of a conduction type different from said first conduction type; and a drain region provided adjacent an opposite surface of said semiconductor substrate and composed of a high impurity density semiconductor layer of said first conduction type.

12. A static induction type transistor comprising: a low impurity density region of a first conduction one surface of a semiconductor substrate; a plurality of spaced apart source regions of high impurity density semiconductor material of said first conduction type located in said low impurity density region; a gate region in said low impurity density region surrounding a unified area containing said source regions, spaced from said source regions and composed of high impurity density semiconductor material of a second conduction type different from said first conduction type, the space between said source regions and between each source region and said gate region begin occupied by a portion of said low impurity density region free of any material of a conduction type different from said first conduction type; and a drain region provided adjacent another surface of said semiconductor substrate and composed of a high impurity density semiconductor layer of said second conduction type, whereby said source regions and said drain region are arranged to function as cathode and anode regions, respectively.

* * * * *

UNITED STATES PATENT AND TRADEMARK OFFICE
CERTIFICATE OF CORRECTION

PATENT NO. : 4,994,870

DATED : February 19, 1991

INVENTOR(S) : S. Aoki et al

It is certified that error appears in the above-identified patent and that said Letters Patent is hereby corrected as shown below:

Col. 2, line 11, after "region" insert --of--.

Col. 3, line 48, after "surface" insert hyphen -- - --; after "gate" insert hyphen -- - --.

Col. 5, line 47, after "p" insert hyphen -- - --.

Col. 7, line 10 after "conduction" insert --type provided on--.

Signed and Sealed this

Twenty-first Day of July, 1992

Attest:

DOUGLAS B. COMER

*Attesting Officer*      *Acting Commissioner of Patents and Trademarks*